US011621257B2

(12) United States Patent
Keeth et al.

(10) Patent No.: US 11,621,257 B2
(45) Date of Patent: Apr. 4, 2023

(54) WAFER-SCALE MEMORY TECHNIQUES

(71) Applicant: Micron Technology, Inc., Boise, ID (US)

(72) Inventors: Brent Keeth, Boise, ID (US); Bambi L. DeLaRosa, Frisco, TX (US); Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 17/162,796

(22) Filed: Jan. 29, 2021

(65) Prior Publication Data

US 2021/0240344 A1  Aug. 5, 2021

Related U.S. Application Data

(60) Provisional application No. 62/969,455, filed on Feb. 3, 2020.

(51) Int. Cl.
| | |
|---|---|
| *G11C 5/06* | (2006.01) |
| *G06F 3/06* | (2006.01) |
| *H01L 25/00* | (2006.01) |
| *H01L 25/18* | (2023.01) |
| *H01L 21/00* | (2006.01) |
| *G11C 29/00* | (2006.01) |
| *H01L 27/108* | (2006.01) |

(52) U.S. Cl.
CPC ............. *H01L 25/50* (2013.01); *G11C 5/06* (2013.01); *H01L 21/00* (2013.01); *H01L 25/18* (2013.01); *G06F 3/061* (2013.01); *G06F 3/0655* (2013.01); *G11C 29/006* (2013.01); *H01L 27/108* (2013.01)

(58) Field of Classification Search
CPC ......... G06F 3/061; G06F 3/0655; G11C 5/06; G11C 29/006
USPC ......................................................... 711/154
See application file for complete search history.

(56) References Cited

U.S. PATENT DOCUMENTS

| | | | | | |
|---|---|---|---|---|---|
| 5,905,305 | A | * | 5/1999 | Fogal | H01L 23/3107 |
| | | | | | 257/E23.101 |
| 6,288,421 | B1 | * | 9/2001 | Keeth | H01L 27/108 |
| | | | | | 257/296 |
| 6,589,875 | B1 | * | 7/2003 | Bode | H01L 21/31116 |
| | | | | | 257/E21.252 |
| 9,142,459 | B1 | * | 9/2015 | Kumar | H01L 21/0337 |

(Continued)

OTHER PUBLICATIONS

Changing Wafer Sizea and the Move to 300mm, pp. 7-1 to 7-16.*
Does Size matter? Understanding Wafer Size.pdf.*
Wikedia Wafer Definition.*

*Primary Examiner* — Christopher B Shin
(74) *Attorney, Agent, or Firm* — Schwegman Lundberg & Woessner, P.A.

(57) ABSTRACT

Techniques for wafer-scale memory device and systems are provided. In an example, a wafer-scale memory device can include a large single substrate, multiple memory circuit areas including dynamic random-access memory (DRAM), the multiple memory circuit areas integrated with the substrate and configured to form an array on the substrate, and multiple streets separating the memory circuit areas. The streets can accommodate attaching the substrate to a wafer-scale processor. In certain examples, the large, single substrate can have a major surface area of more than 20,000 square millimeters (mm²).

20 Claims, 13 Drawing Sheets

(56) References Cited

U.S. PATENT DOCUMENTS

| | | | |
|---|---|---|---|
| 2005/0047248 A1* | 3/2005 | Kim | G11C 5/04 257/E21.526 |
| 2012/0233510 A1* | 9/2012 | Colgan | G11C 5/025 365/51 |
| 2015/0200166 A1* | 7/2015 | Kono | H01L 23/562 257/529 |
| 2016/0118371 A1* | 4/2016 | Park | H01L 24/17 257/773 |
| 2017/0317055 A1* | 11/2017 | Emma | G11C 29/56016 |
| 2018/0046908 A1* | 2/2018 | Cox | G06F 13/00 |
| 2019/0172820 A1* | 6/2019 | Meyers | H01L 23/5226 |
| 2020/0227335 A1* | 7/2020 | Eid | H01L 23/16 |
| 2021/0248094 A1* | 8/2021 | Norman | G06F 12/10 |

* cited by examiner

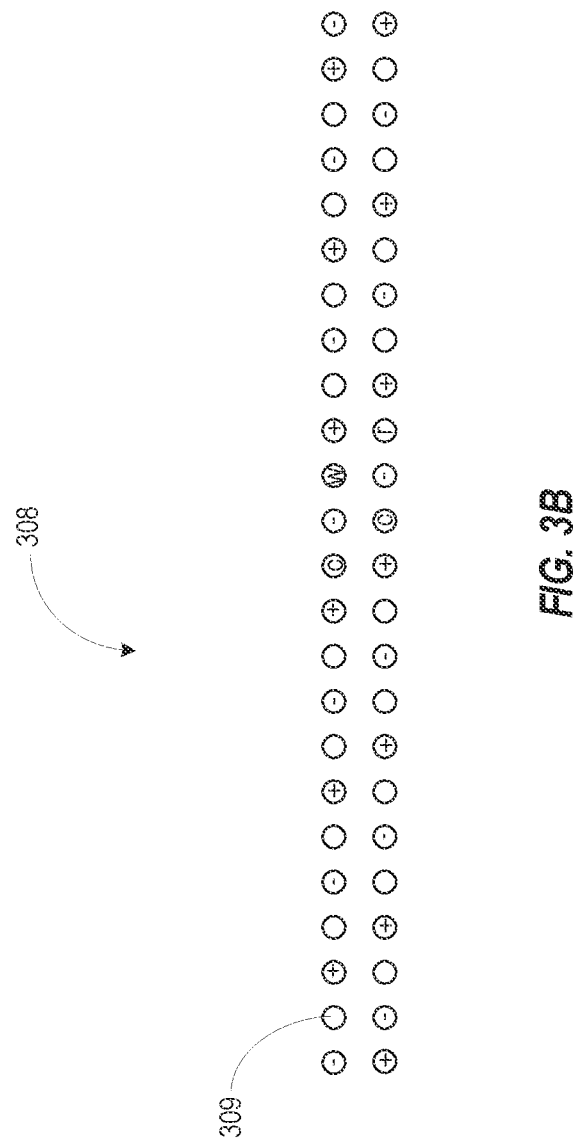

WAFER-SCALE MEMORY TECHNIQUES

PRIORITY AND RELATED APPLICATIONS

This application claims the benefit of priority to Keeth, U.S. Provisional Patent Application No. 62/969,455, titled, "DRAM TECHNIQUES FOR WAFER PROCESSOR", filed Feb. 3, 2020, which is hereby incorporated by reference herein in its entirety.

BACKGROUND

Recent processor techniques have enabled wafer-scale devices to be fabricated that can include a wafer sized substrate including multiple interconnected processor dies. Such processor techniques are envisioned to provide an advanced computing processor, computing server, or the like that is capable of rapidly and efficiently ingesting and processing large volumes of data for at least the purposes of allowing enhanced artificial intelligence algorithms and machine learning models to be implemented.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3B illustrates an example of the signals associated with a channel I/O area of an IO stripe of a tile of a wafer-scale memory device.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
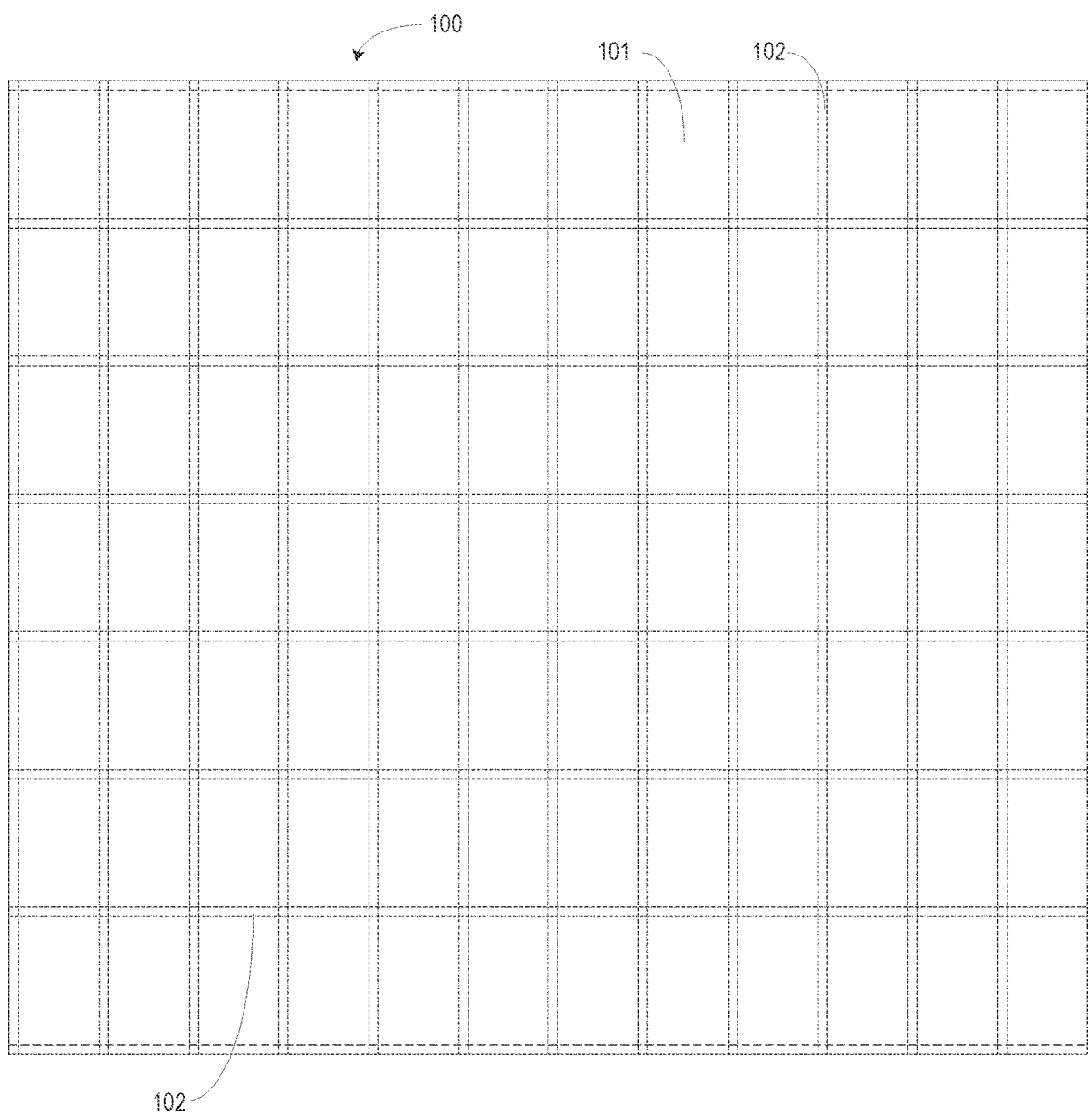
FIG. 1 illustrates generally an example layout of wafer-scale memory device.

FIG. 1 illustrates generally an example layout of wafer-scale memory device 100. The wafer-scale memory device 100 can be formed on an unsingulated wafer section, or singular substrate, including integrated circuits therein or thereon, and can be large. For example, the major surface area of a semiconductor substrate of a wafer-scale memory device can be greater than 20,000 square millimeters ($mm^2$), greater than 30,000 $mm^2$, or greater than 40,000 $mm^2$. In some examples, the area of a large substrate of a wafer-scale memory device can be around 46,000 $mm^2$. The wafer-scale memory device 100 is configured to attach with a wafer-scale processor also including an unsingulated wafer of semiconductor material. The wafer-scale memory device 100 can have memory circuit areas 101 or blocks arranged in an array. Each memory circuit area or block 101 can be bordered by multiple streets 102. The areas of the streets 102 can be used to secure the wafer-scale memory device 100 to a wafer-scale processor to form a wafer-scale computer system. Such a wafer-scale computer system can be very energy efficient while also providing enormous processing bandwidth. In the illustrated example, the wafer-scale memory device 100, and a corresponding wafer-scale processor, can include 84 memory circuit areas arranged in a 12×7 array. As a result, the streets will be sized to provide attachment sites for securing to a wafer scale processor. In some examples, attachment site may be present at intersections between perpendicularly-expending streets. The size and configuration of the memory circuit areas may vary based on the designed arrangement and configuration of attachment mechanisms. Although the streets 102 may not be completely devoid of processing circuitry, such circuitry, if present, can be integrated to withstand stress. The stress can be a result of the areas of the streets 102 being used to secure the wafer-scale memory device 100 with the corresponding wafer-scale processor, as well as, with other devices in some examples. In some examples, a width of a street 102 can be in a range from a few hundred micrometers (μm) to a few millimeters (mm) to accommodate mechanisms (e.g., screws, rivets, etc.) for securing the wafer-scale memory device 100 to a wafer-scale processor.

High performance of a wafer-scale processor can be achieved by connecting the processing circuits to high-speed memory such as the memory of the wafer-scale memory device 100 discussed above. In some examples, data exchange speed between the processor circuits and the memory can be a factor in the processor performance. The present inventors have recognized various connection designs to allow high performance data exchange speeds between a wafer-scale processor and a wafer-scale memory device. In certain examples, a data exchange rate of 125 terabytes per second (TB/s) or more can be achieved for a wafer-scale processor matching the layout of the wafer-scale memory device 100 of FIG. 1. In some examples, a connection design for the wafer-scale memory device of FIG. 1 can provide between 125 TB/s and 336 TB/s.

Figure 2:
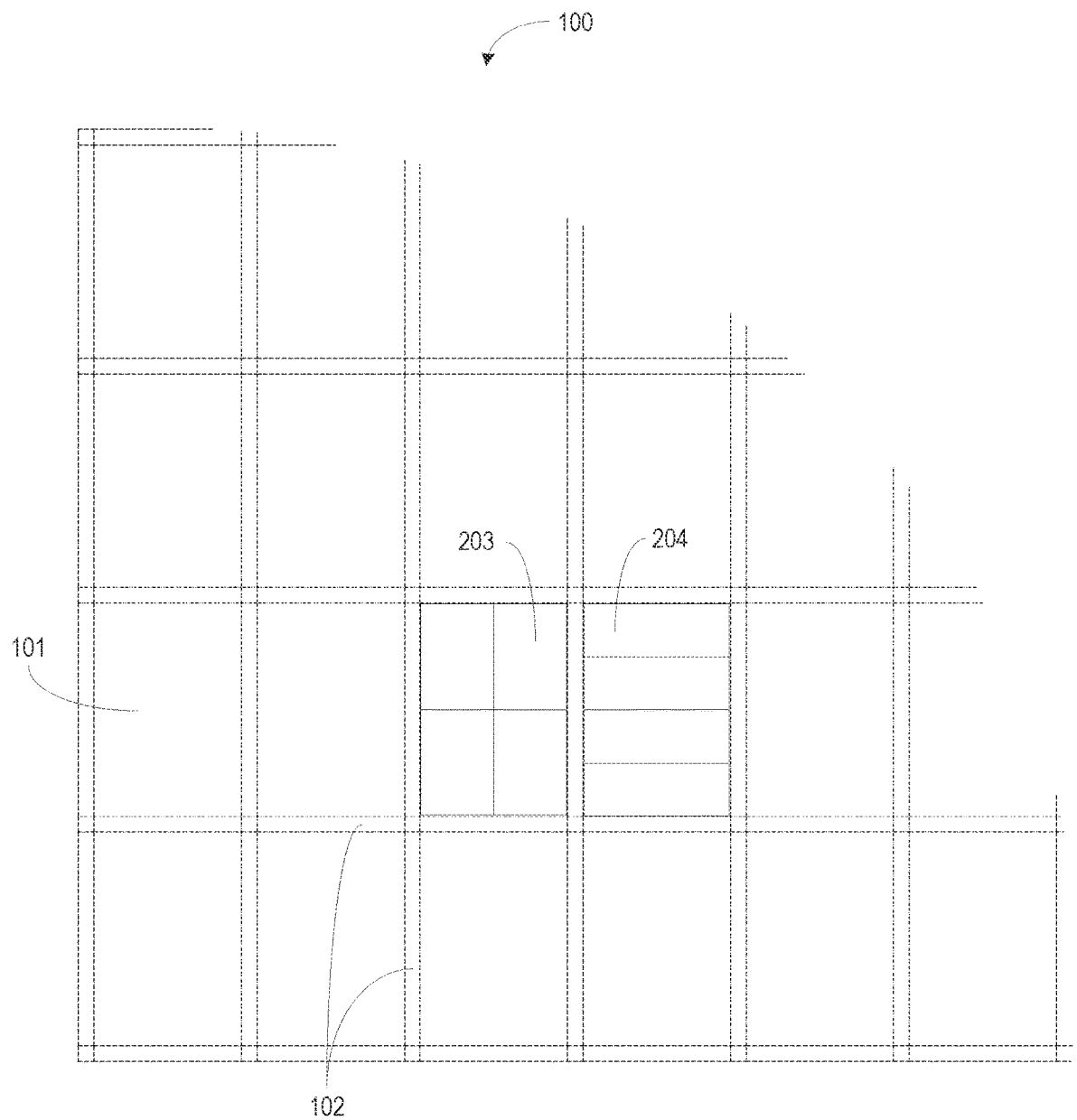
FIG. 2 illustrates a portion of the layout of the wafer-scale memory device.
Figure 3A:
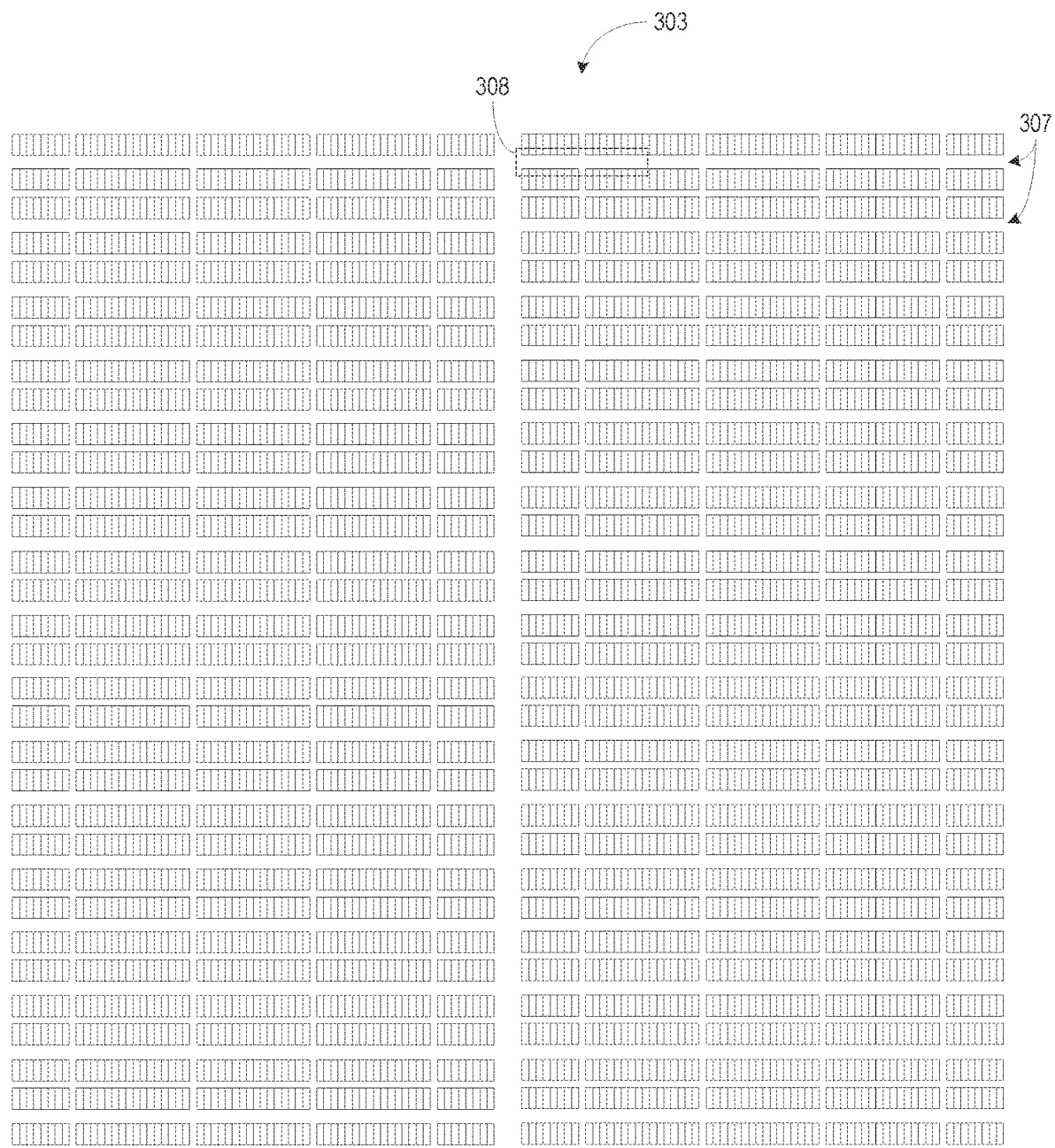
FIG. 3A illustrates generally an example connection layout of an area of a single DRAM tile of a wafer-scale memory device.

FIG. 2 illustrates a portion of the layout of the wafer-scale memory device 100 of FIG. 1 with overlays of options for orienting memory tiles 203, 204, or memory tile circuits, of the wafer-scale memory device 100 to overlay the memory circuit areas 102 of the layout. In certain examples, four tiles 203, 204 of dynamic random-access memory (DRAM) can overlay each memory circuit area 102 of the layout. Outer perimeters of memory tiles, not adjacent streets may be closely spaced relative to one another, as in conventional wafer processing, wherein memory device site are closely spaced to one another relative to scribe line locations, along which conventional semiconductor die constructions may be singulated. In some examples, the four tiles 203 of DRAM can be arranged linearly. In some examples, the four tiles 204 of DRAM can be arranged in a grid or other two-dimensional arrangement. In certain examples, each tile of DRAM can exchange data with a wafer-scale processor at a rate of 1 TB/s. For the example layout of FIG. 1, each of the 84 memory circuit areas can accommodate 4 tiles, or tile circuits, of DRAM for a total of 336 tiles included within a wafer-scale memory device 100 coupled to the processor and a total bandwidth of 336 TB/s of data exchange between the wafer-scale memory device 100 and the corresponding wafer-scale processor. In other examples, some (or in some cases all), memory tile circuits can be of other memory storage technologies, than DRAM FIG. 3A illustrates generally an example connection layout of an area of a single DRAM tile 303 of a wafer-scale memory device. The layout can include 128 channels. Each channel can be 16 or 18 bits wide to access 64 Mb of data. 32 bytes of data can be exchanged on each channel every 4 ns column command interval (tCCD). Each tile 303 can include 2816 channel terminations (not shown) for signals to interface with the corresponding wafer-scale processor. Each tile cam also include about 2400 power/ground through-silicon vias (TSVs) (not shown) to extend power through the wafer-scale memory device to or from other components of the system. In certain examples, the terminations can be grouped in IO stripes 307 such as 16 IO stripes 307 extending across the DRAM tile 303. Each 10 stripe 307 can include 8 channels and each channel 10 area 308 of each channel can include around 22 signals terminations and around 26 power terminations.

FIG. 3B illustrates an example of the signals associated with a channel I/O area 308 of an IO stripe 307 of a tile 303 of a wafer-scale memory device. The signals can generally be identified as power (+, −), data 309, command/address (C), write strobe (w), and read strobe (r). In some examples, the channel can include 16 data signals (DQs) 309. In some examples having error correction, the channel can include 18 data signals (DQs) (309). Each tile 303 can include 8 or 9 Gb spread over 8 banks of memory per channel. Such a memory tile 303 can occupy a footprint of about 116 mm² or less of the wafer-scale memory device.

Figure 4:
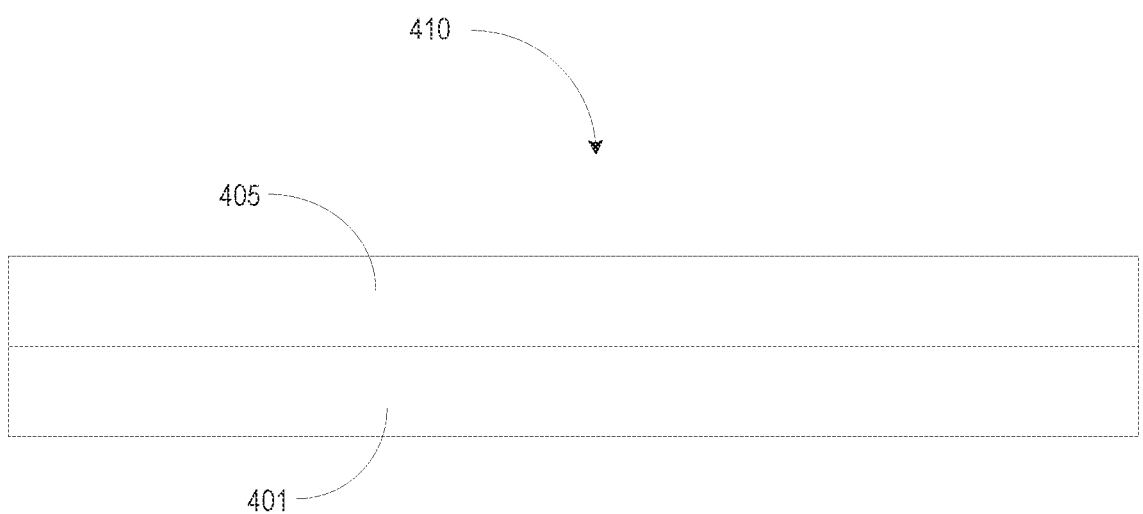
FIG. 4 illustrates generally a cross-section view of an example wafer-scale system.

FIG. 4 illustrates generally a cross-section view of an example wafer-scale system 410. In certain examples, the wafer-scale system 410 can include a wafer-scale processor 405 and a wafer-scale memory device 401 coupled together mechanically and electrically into a wafer-scale stack including a wafer-scale memory stack of one memory device. In certain examples, each of the wafer-scale processor and wafer-scale memory device have a single substrate in which the circuits of each device are integrated within or upon. In addition, the dimensions of each single substrate provide a footprint greater than 20,000 mm² in area. In certain examples, the footprint of any one of the substrates provide a footprint of more than 45,000 mm² in area.

Figure 5A:
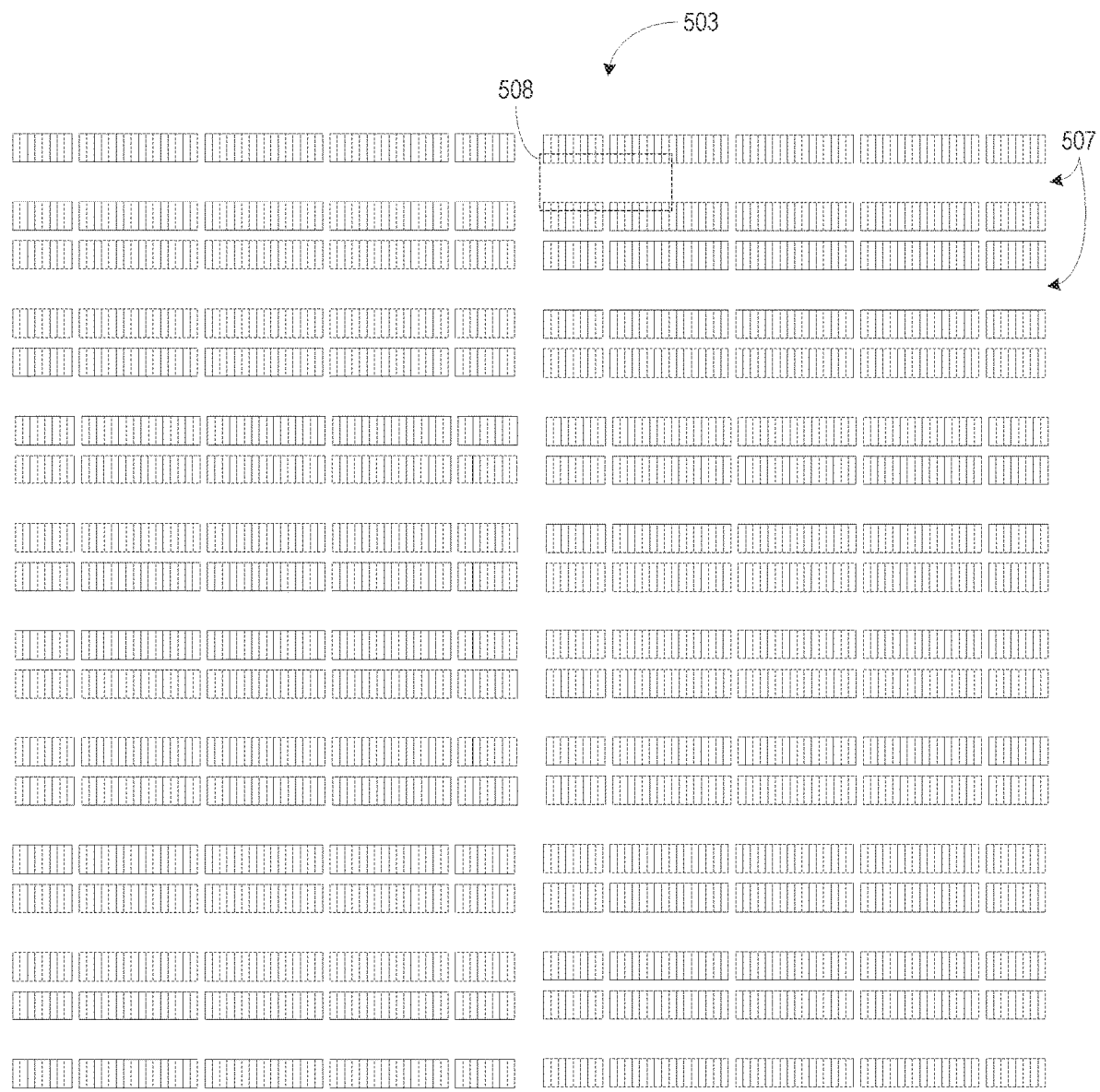
FIG. 5A illustrates generally an example connection layout of a single DRAM tile of a wafer-scale memory device for connection to a wafer-scale processor system.

FIG. 5A illustrates generally an example connection layout of a single DRAM tile 503 of a wafer-scale memory device for connection to a wafer-scale processor system. The layout can include 64 channels. Each channel can be 40 bits wide to access 64 Mb of data. 64 bytes of data can be exchanged on each channel every 4 ns tCCD. Each tile can include 2560 channel terminations and about 800 power/ground through-silicon vias (TSVs) to extend power through the memory wafer to or from other components of the system. In certain examples, the terminations can be grouped in IO stripes 507 such as 8 IO stripes 507 extending across the DRAM tile 503. Each 10 stripe 507 can include 8 channels and each channel 10 area 508 can include around 40 signals terminations and around 44 power terminations.

Figure 5B:
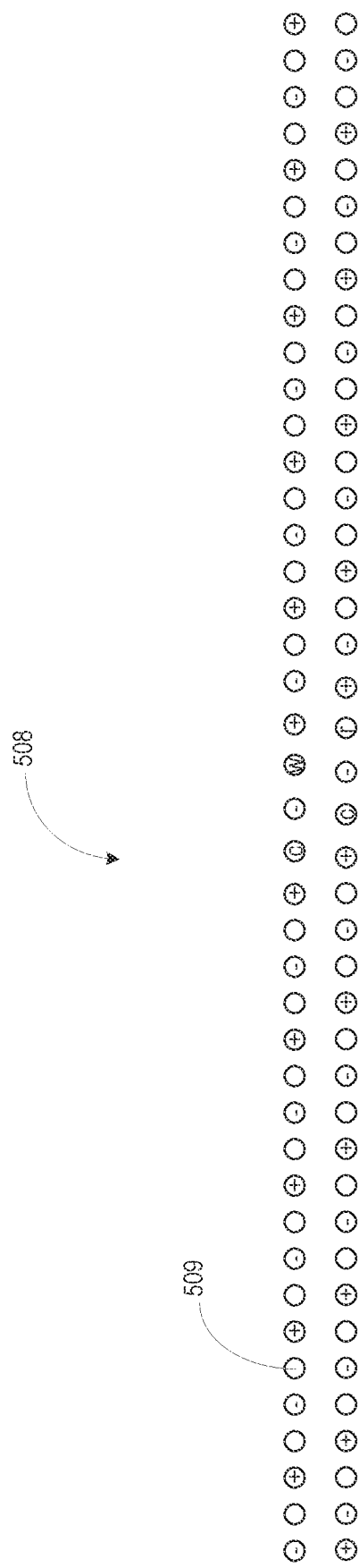
FIG. 5B illustrates generally an example arrangement of the signals associated with a channel I/O area of an IO stripe of a tile of a wafer-scale memory device.

FIG. 5B illustrates generally an example arrangement of the signals associated with a channel I/O area 508 of an IO stripe 507 of a tile 503 of a wafer-scale memory device. The signals can generally be identified as power (+, −), data 509, command/address (C), write strobe (w), and read strobe (r). In some examples, a channel 10 area can include 36 data signals (DQs). In some examples having error correction, the channel 10 area can include 40 data signals (DQs). In certain examples, each area of memory tile 303 can include 8 or 9 Gb spread over 4 banks per channel. Such a memory tile 303 can be about 85 mm² to 103 mm² with 336 gigabytes (GB) of addressable memory.

Figure 6:
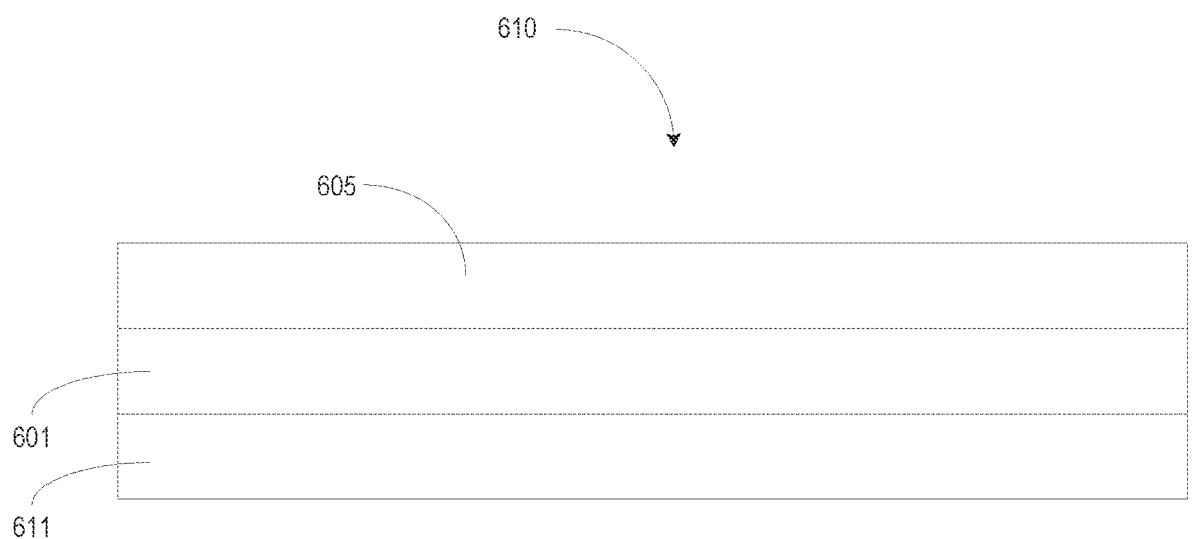
FIG. 6 illustrates generally a cross-section or side view of an example wafer-scale system.

FIG. 6 illustrates generally a cross-section or side view of an example wafer-scale system 610. In certain examples, the wafer-scale system can include a wafer-scale processor 605, a first wafer-scale memory device 601, and a second wafer-scale memory device 611 coupled together mechanically and electrically into a wafer-scale stack including a wafer-scale memory stack of two memory devices 601, 611. In certain examples, each of the wafer-scale processor 605 and the first and second wafer-scale memory devices 601, 611 have a single substrate in which the circuits of each device are integrated within or upon. In addition, the dimensions of each single substrate provide a footprint greater than 20,000 mm² in area. In certain examples, the footprint of any one of the substrates provide a footprint of more than 45,000 mm² in area. In certain examples, FIG. 5A illustrates generally the IO stripe layout of a tile of the first and second wafer-scale memory devices 601, 611 of the wafer-scale system 610.

Figure 7:
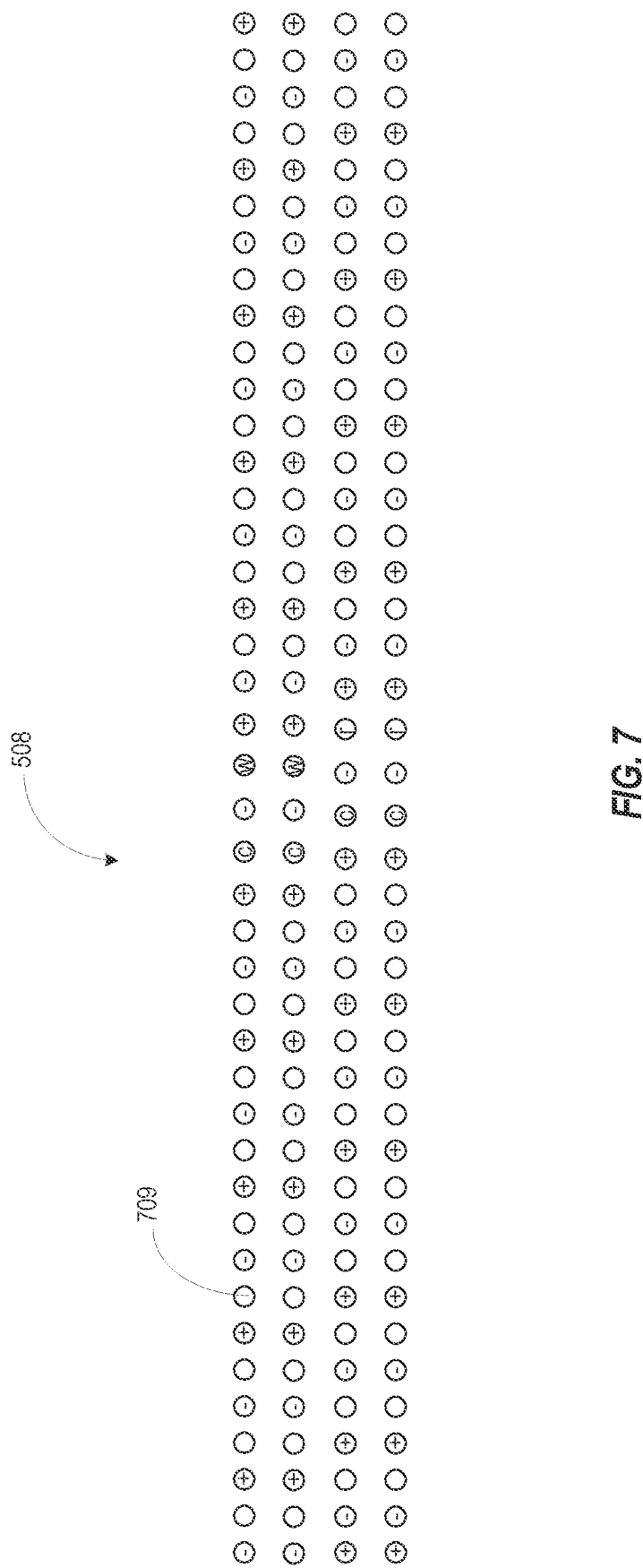
FIG. 7 illustrates generally an example of the signals associated with a channel I/O area of an IO stripe of a tile of either a first or second wafer-scale memory device of a wafer-scale system including two, stacked, wafer-scale memory devices.
Figure 10:
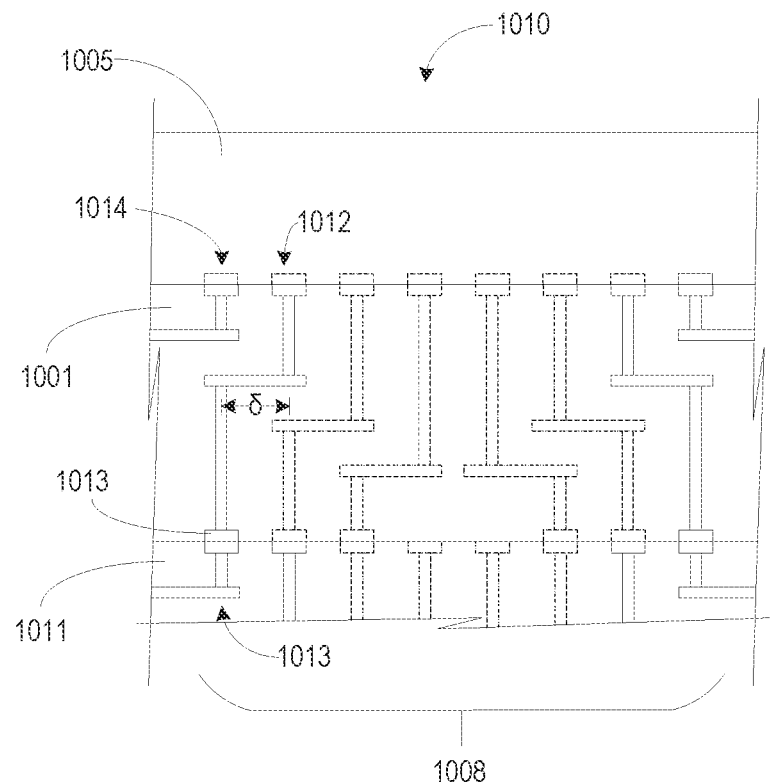
FIG. 10 illustrates generally a partial cross-section of a wafer-scale system.

FIG. 7 illustrates generally an example of the signals associated with a channel I/O area (e.g., FIG. 5A, 508) of an IO stripe (e.g., FIG. 5A, 507) of a tile of either a first or second wafer-scale memory device (e.g., FIG. 6, 601, 611) of a wafer-scale system (e.g., FIG. 6, 610) including two, stacked, wfare-scale memory devices (FIG. 6, 601, 611). The signals can generally be identified as power (+, −), data 709, command/address (C), write strobe (w), and read strobe (r). In some examples, the channel can include 36 data signals (DQs). In some examples having error correction, the channel can include 40 data signals (DQs). In certain examples, each tile area can include 8 or 9 Gb spread over 4 banks per channel. An area of such a memory tile can be about 67 mm² to 77 mm² with 672 gigabytes (GB) of addressable memory. The signals terminations on a first wafer-scale memory device (e.g., FIG. 6, 601) can be arranged to allow channel and power signals of the first wafer-scale memory device to be routed to the adjacent memory circuit areas and channel signals and channel and power signals of the second wafer-scale memory device (FIG. 6, 611) to be passed via TSVs to the second wafer-scale memory device. FIG. 10 illustrates an example TSV design to allow each of the wafer-scale memory devices of a stacked configuration to be the same.

Figure 8:
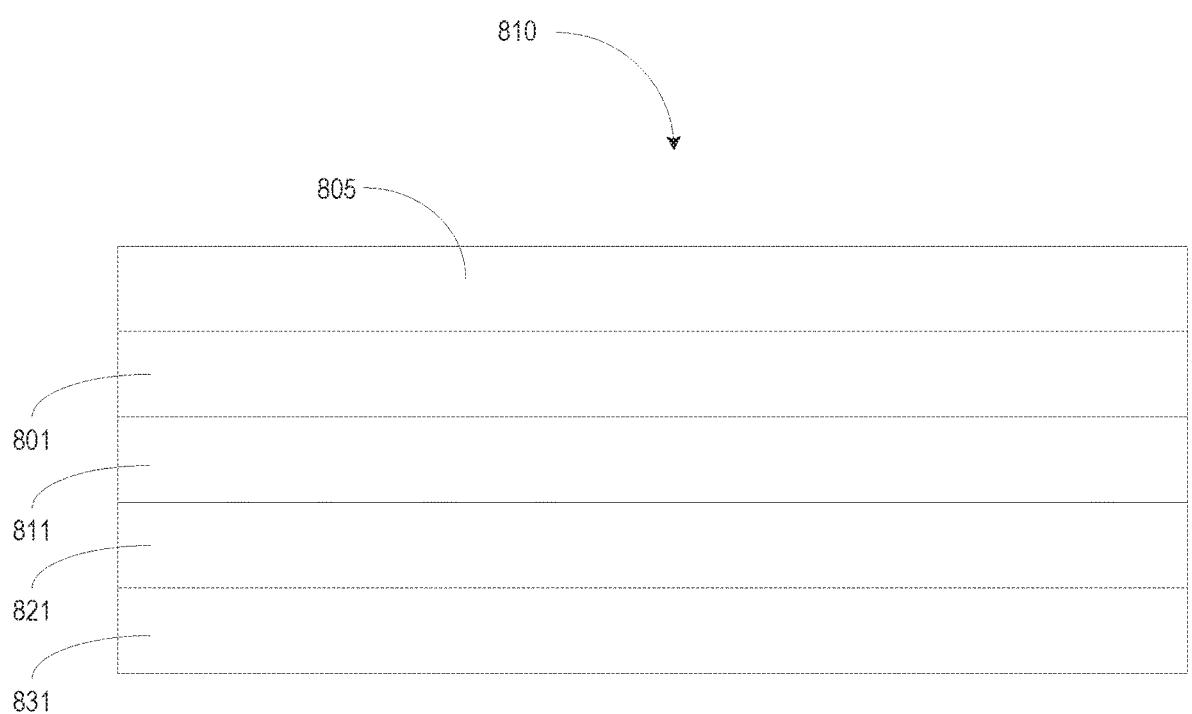
FIG. 8 illustrates generally a cross-section or side view of an example wafer-scale system.

FIG. 8 illustrates generally a cross-section or side view of an example wafer-scale system 810. In certain examples, the wafer-scale system can include a wafer-scale processor 805, a first wafer-scale memory device 801, a second wafer-scale memory device 811, a third wafer-scale memory device 821, and a fourth wafer-scale memory device 831 coupled together mechanically and electrically into a wafer-scale stack including a wafer-scale memory stack of four memory device 801, 811, 821, 831. In certain examples, each of the wafer-scale processor 805 and the multiple wafer-scale memory devices 801, 811, 821, 831 have a single substrate in which the circuits of each device are integrated within or upon. In addition, the dimensions of each single substrate provide a footprint greater than 20,000 mm$^2$ in area. In certain examples, the footprint area of any one of the substrates can be more than 45,000 mm$^2$. In certain examples, a general layout of the wafer-scale processor 805 or the wafer-scale memory devices 801, 811, 821, 831 can correspond to the layouts of FIG. 1 and one of the tile layouts of FIG. 2.

Figure 9A:
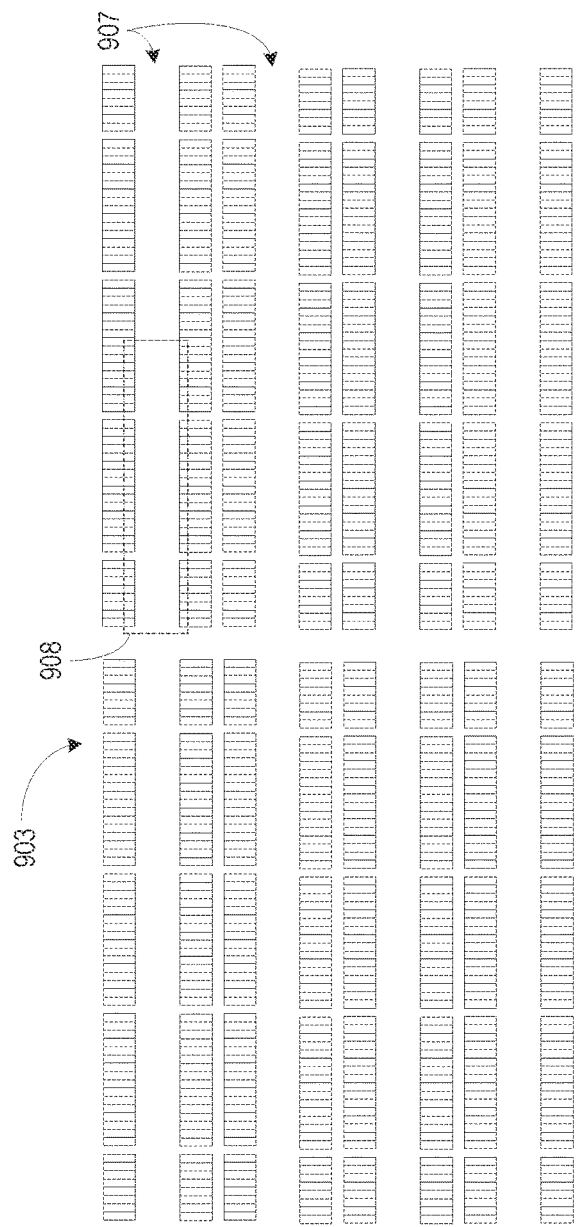
FIG. 9A illustrates generally an example connection layout of a single DRAM tile of a wafer-scale memory device for the system of FIG. 8.

FIG. 9A illustrates generally an example connection layout of a single DRAM tile 903 of a wafer-scale memory device for the system of FIG. 8. The layout of the tile 903 can include 64 channels. Each channel can be 40 bits wide to access 64 MB of data. 64 bytes of data can be exchanged on each channel every 4 ns tCCD. Each tile 903 can include 2560 channel terminations and about 800 power/ground through-silicon vias (TSVs) to extend power through the wafer-scale memory device to or from other components of the system. In certain examples, the terminations can be grouped in IO stripes 907 such as 4 IO stripes 907 extending across the DRAM tile 903. Each 10 stripe 907 can 640 terminations with about 480 configured to pass through any one wafer-scale memory device. Each 10 stripe 907 can include 8 channels and each channel 10 area 908 can include around 40×4 (160) signals terminations and around 44×4 (176) power terminations.

Figure 9B:
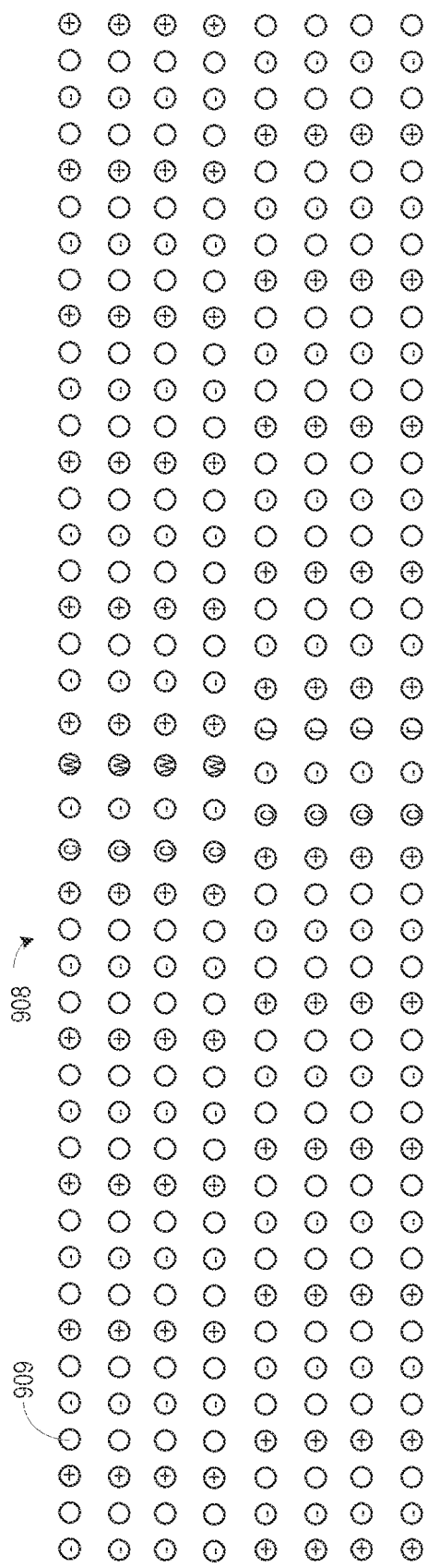
FIG. 9B illustrates generally an example of the signals associated with a channel I/O area of an IO stripe of a tile of the memory system of FIG. 9A.

FIG. 9B illustrates generally an example of the signals associated with a channel I/O area 908 of an IO stripe of a tile of the memory system of FIG. 9A. The signals can generally be identified as power (+, −), data, command/address (C), write strobe (w), and read strobe (r). In some examples, a channel can include 36 data signals (DQs). In some examples having error correction, the channel can include 40 data signals (DQs). In certain examples, each tile area can include 8 or 9 Gb spread over 4 banks per channel. Area of such a memory tile can be about 52 mm$^2$ to 60 mm$^2$ with 1344 gigabytes (GB) of addressable memory.

FIG. 10 illustrates generally a partial cross-section of a wafer-scale system 1010. The wafer-scale system can include a wafer-scale processor and multiple wafer-scale memory devices. The partial cross-section view includes a cross-section view of an example channel 10 area 1008 of an IO stripe of a first wafer-scale memory device 1001 and a partial cross-section view of an example 10 channel area 1008 of an IO stripe of a second wafer-scale memory device 1011. The cross-section view shows that the TSVs of each wafer-scale memory device 1001, 1011 reposition 10 terminations as the TSVs conduct signals from a first side of the wafer-scale memory device to the second side of the wafer-scale memory device. For example, a first row 1012 of terminations of TSVs located on a first side of the wafer-scale memory device 1101 can be laterally offset (δ) from the corresponding row 1013 of terminations of the TSVs on a second side of the wafer-scale memory device 1101. In certain examples, the corresponding row 1013 of TSV terminations on the second side of the wafer-scale memory device 1101 can be aligned with a second row 1014 of terminations on the first side of the wafer-scale memory device 1101. As such, each wafer-scale memory device in a stack can use the signals associated with the second row 1014 of terminations on the first side and can pass the signals of the first row 1012 to the next wafer-scale memory device in the stack. TSV routing according the present example can allow each wafer-scale memory device in a stack to be the same.

In general, example systems according to the present subject matter can have 336 GB to 1344 GB of addressable DRAM memory per tile area. Each DRAM tile can provide 1 terabyte/sec (TB/s) of bandwidth. Total DRAM bandwidth can be 336 TB/s or ~2.7 petabits/sec. From a power standpoint, the wafer-scale memory system, having a bandwidth of 1024 GB/sec., can limit power consumption to between 2.95 pj/bit using a payload of 64 bytes to 1.98 pj/bit using a payload of 1024 bytes. For a 46,000 mm$^2$ wafer-scale processor system, a wafer-scale memory device can consume about 5.4 KW of power at peak bandwidth (e.g., 16 W per tile).

In certain examples, a frame-based communication protocol is used to interface with the wafer-scale memory system to take efficiently utilize the 2 command/address signals per channel. In certain examples, the data frames of the protocol can contain 32 or 64 bytes of data. If the memory system stores error correction information, the data frames can include 36 or 68 bytes of data. Each data frame can transfer in 4 ns. Command frames can include 32 bits and can be transferred in 2 ns. In certain examples, the protocol can include 2 command frames per data frame.

Figure 11:
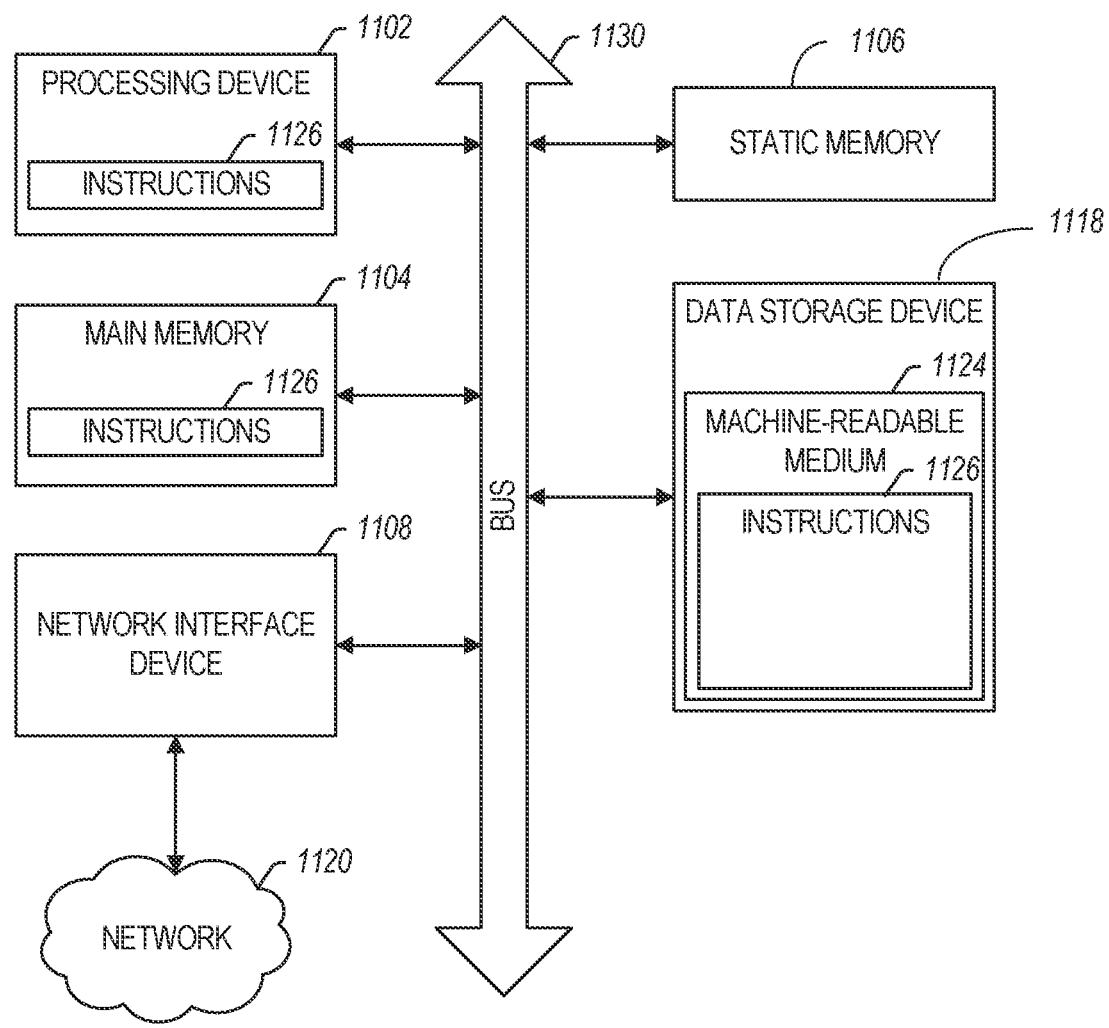
FIG. 11 illustrates a block diagram of an example machine (e.g., a host system) which may include one or more memory devices and/or systems as described above.

FIG. 11 illustrates a block diagram of an example machine (e.g., a host system) 1100 which may include one or more memory devices and/or systems as described above. In alternative embodiments, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible overtime and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 1100 may include a processing device 1102 (e.g., a hardware processor, a central processing unit (CPU), a graphics processing unit (GPU), a hardware processor core, or any combination thereof, etc.), a main memory 1104 (e.g., read-only memory (ROM), dynamic random-access memory (DRAM) such as synchronous DRAM (SDRAM) or Rambus DRAM (RDRAM), etc.), a static memory 1106 (e.g., static random-access memory (SRAM), etc.), and a storage system 1118, some or all of which may communicate with each other via a communication interface (e.g., a bus) 1130. In one example, the main memory 1104 includes one or more memory devices as described in examples above.

The processing device 1102 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1102 can also be one or more special-purpose processing devices such as an application specific integrated circuit (ASIC), a field programmable gate array (FPGA), a digital signal processor (DSP), network processor, or the like. The processing device 1102 can be configured to execute instructions 1126 for performing the operations and steps discussed herein. The computer system 1100 can further include a network interface device 1108 to communicate over a network 1120.

The storage system 1118 can include a machine-readable storage medium (also known as a computer-readable medium) on which is stored one or more sets of instructions 1126 or software embodying any one or more of the methodologies or functions described herein. The instructions 1126 can also reside, completely or at least partially, within the main memory 1104 or within the processing device 1102 during execution thereof by the computer system 1100, the main memory 1104 and the processing device 1102 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1100 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1100 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1126 (e.g., software, programs, an operating system (OS), etc.) or other data are stored on the storage system 1118 can be accessed by the main memory 1104 for use by the processing device 1102. The main memory 1104 (e.g., DRAM) is typically fast, but volatile, and thus a different type of storage than the storage system 1118 (e.g., an SSD), which is suitable for long-term storage, including while in an "off" condition. The instructions 1126 or data in use by a user or the machine 1100 are typically loaded in the main memory 1104 for use by the processing device 1102. When the main memory 1104 is full, virtual space from the storage system 1118 can be allocated to supplement the main memory 1104; however, because the storage system 1118 device is typically slower than the main memory 1104, and write speeds are typically at least twice as slow as read speeds, use of virtual memory can greatly reduce user experience due to storage system latency (in contrast to the main memory 1104, e.g., DRAM). Further, use of the storage system 1118 for virtual memory can greatly reduce the usable lifespan of the storage system 1118.

The instructions 1124 may further be transmitted or received over a network 1120 using a transmission medium via the network interface device 1108 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 1108 may include one or more physical jacks (e.g., Ethernet, coaxial, or phone jacks) or one or more antennas to connect to the network 1120. In an example, the network interface device 1108 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1100, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A wafer-scale memory device comprising:
a single substrate having a memory area across a major surface area of 20,000 to 46,000 square millimeters (mm$^2$);
the memory area formed by multiple memory circuit areas, the multiple memory circuit areas including dynamic random-access memory (DRAM), the multiple memory circuit areas integrated with the substrate and forming a memory array on the substrate; and
multiple streets separating respective memory circuit areas, the streets configured to provide attachment locations for attaching the substrate to a wafer-scale processor.

2. The wafer-scale memory device of claim 1, wherein each memory circuit area includes multiple tiled memory circuits.

3. The wafer-scale memory device of claim 2, wherein each memory tile circuit includes terminations of 128 channels of the DRAM memory, the terminations configured to couple with terminations of the wafer-scale processor.

4. The wafer-scale memory device of claim 3, wherein the terminations are arranged in 16 input/output (IO) stripes extending across a first dimension of a first memory tile circuit of the multiple tiled memory circuits of each memory circuit area.

5. The wafer-scale memory device of claim 3, wherein each channel includes 16 data signal terminations.

6. The wafer-scale memory device of claim 2, wherein each memory tile circuit includes terminations of 64 channels of the DRAM memory, the terminations configured to couple with terminations of the wafer-scale processor.

7. The wafer-scale memory device of claim 6, wherein the terminations are arranged in 8 input/output (IO) stripes extending across a first dimension of a first memory tile circuit of the multiple tiled memory circuits of each memory circuit area.

8. The wafer-scale memory device of claim 7, wherein each channel includes 32 data signal terminations.

9. The wafer-scale memory device of claim 6, wherein the DRAM memory is coupled to terminations of a first 32 channels of the 64 channels.

10. The wafer-scale memory device of claim 9, wherein the wafer-scale memory device is a first wafer-scale memory device configured to couple with a second wafer-scale memory device to form a stack of wafer-scale memory devices; and
wherein the first wafer-scale memory device includes through silicon vias (TSVs) configured to route terminations of a second 32 channels to the second wafer-scale memory device of the stack of wafer-scale memory devices.

11. The wafer-scale memory device of claim 6, wherein the terminations are arranged in 4 input/output (IO) stripes extending across a first dimension of a first memory tile circuit of the multiple tiled memory circuits of each memory circuit area.

12. The wafer-scale memory device of claim 11, wherein each channel includes 32 data signal terminations.

13. The wafer-scale memory device of claim 12, wherein the DRAM memory is coupled to terminations of a first 16 channels of the 64 channels.

14. The wafer-scale memory device of claim 13, wherein the wafer-scale memory device is a first wafer-scale memory device configured to couple with a second wafer-scale memory device to form a stack of wafer-scale memory devices; and
wherein the first wafer-scale memory device includes through silicon vias (TSVs) configured to route terminations of a second 48 channels of the 64 channels to the second wafer-scale memory device of the stack of wafer-scale memory devices.

15. A system comprising:
a wafer-scale processor including multiple processing circuits; and
a wafer-scale memory coupled to the wafer-scale processor, the wafer-scale memory including a first wafer-scale memory device having a first substrate with a major surface area of more than 40,000 square millimeters (mm$^2$), the first substrate having a first semiconductor memory array integrated therewith, the first semiconductor memory array comprising multiple memory circuit areas integrated with the first substrate; and
multiple streets separating respective memory circuit areas, the wafer scale memory coupled to the wafer-scale processor through attachment sites in the streets.

16. The system of claim 15, wherein the wafer-scale memory stack includes a second wafer-scale memory device coupled with the first wafer-scale memory device, the second wafer-scale memory device including:
a second substrate with a major surface area of more than 20,000 to 46,000 mm$^2$; and
a second semiconductor memory array integrated with the second substrate.

17. The system of claim 15, including 20,000 channels configured to exchange information between the multiple processing circuits of the wafer-scale processor and the wafer-scale memory.

18. The system of claim 17, wherein each channel of the 20,000 channels includes terminations for 32 data signals.

19. The system of claim 15, wherein a bandwidth of the wafer-scale memory is equal to or greater than 300 terabytes per second.

20. The system of claim 15, wherein the wafer-scale memory provides 336 gigabytes of addressable memory.

* * * * *